(12) United States Patent
Kim et al.

(10) Patent No.: US 11,358,974 B2
(45) Date of Patent: Jun. 14, 2022

(54) SILYLAMINE COMPOUND, COMPOSITION FOR DEPOSITING SILICON-CONTAINING THIN FILM CONTAINING THE SAME, AND METHOD FOR MANUFACTURING SILICON-CONTAINING THIN FILM USING THE COMPOSITION

(71) Applicant: DNF CO., LTD., Daejeon (KR)

(72) Inventors: Sung Gi Kim, Daejeon (KR); Jeong Joo Park, Daejeon (KR); Joong Jin Park, Daejeon (KR); Se Jin Jang, Jeju-si (KR); Byeong-il Yang, Daejeon (KR); Sang-Do Lee, Daejeon (KR); Sam Dong Lee, Daejeon (KR); Sang Ick Lee, Daejeon (KR); Myong Woon Kim, Daejeon (KR)

(73) Assignee: DNF CO., LTD., Daejeon (KR)

( * ) Notice: Subject to any disclaimer, the term of this patent is extended or adjusted under 35 U.S.C. 154(b) by 81 days.

(21) Appl. No.: 16/499,196

(22) PCT Filed: Mar. 28, 2018

(86) PCT No.: PCT/KR2018/003643
§ 371 (c)(1),
(2) Date: Sep. 27, 2019

(87) PCT Pub. No.: WO2018/182305
PCT Pub. Date: Oct. 4, 2018

(65) Prior Publication Data
US 2020/0392294 A1   Dec. 17, 2020

(30) Foreign Application Priority Data

Mar. 29, 2017 (KR) .................. 10-2017-0040078
Mar. 27, 2018 (KR) .................. 10-2018-0034940

(51) Int. Cl.
| | | |
|---|---|---|
| *C07F 7/02* | (2006.01) | |
| *C23C 16/30* | (2006.01) | |
| *C23C 16/34* | (2006.01) | |
| *H01L 21/02* | (2006.01) | |
| *C23C 16/50* | (2006.01) | |
| *C23C 16/455* | (2006.01) | |
| *C23C 16/32* | (2006.01) | |
| *C23C 16/36* | (2006.01) | |
| *C23C 16/40* | (2006.01) | |
| *C07F 7/10* | (2006.01) | |
| *C08G 77/62* | (2006.01) | |
| *C08L 83/14* | (2006.01) | |

(52) U.S. Cl.
CPC ............... *C07F 7/025* (2013.01); *C07F 7/10* (2013.01); *C08G 77/62* (2013.01); *C08L 83/14* (2013.01); *C23C 16/308* (2013.01); *C23C 16/325* (2013.01); *C23C 16/345* (2013.01); *C23C 16/36* (2013.01); *C23C 16/401* (2013.01); *C23C 16/45536* (2013.01); *C23C 16/50* (2013.01); *H01L 21/0214* (2013.01); *H01L 21/0217* (2013.01); *H01L 21/0228* (2013.01); *H01L 21/02126* (2013.01); *H01L 21/02164* (2013.01); *H01L 21/02167* (2013.01); *H01L 21/02208* (2013.01); *H01L 21/02219* (2013.01); *H01L 21/02271* (2013.01); *H01L 21/02274* (2013.01); *C08L 2203/16* (2013.01); *C08L 2203/20* (2013.01)

(58) Field of Classification Search
CPC ...................................................... C07F 7/025
See application file for complete search history.

(56) References Cited

U.S. PATENT DOCUMENTS

| | | | |
|---|---|---|---|
| 6,391,803 B1 | 5/2002 | Kim et al. | |
| 2009/0095346 A1* | 4/2009 | Hurley | H01L 31/02168 |
| | | | 136/256 |
| 2014/0363985 A1 | 12/2014 | Jang et al. | |

FOREIGN PATENT DOCUMENTS

| | | |
|---|---|---|
| EP | 2048699 A2 | 4/2009 |
| EP | 2264218 A1 | 12/2010 |
| JP | H01129972 A | 5/1989 |
| JP | 2010066597 A | 3/2010 |
| JP | 2014237644 A | 12/2014 |
| JP | 2016526051 A | 9/2016 |
| KR | 20140143682 A | 12/2014 |
| WO | 2014196827 A2 | 12/2014 |

OTHER PUBLICATIONS

"RN 23636-57-9, RN 22064-55-7," Chemical Abstract Compounds, STN Express, Nov. 16, 1984, 1 page. (See NPL 2, International Search Report Issued in Application No. PCT/KR2018/003643 for Explanation of Relevancy).
ISA Korean Intellectual Property Office, International Search Report Issued in Application No. PCT/KR2018/003643, dated Sep. 3, 2018, WIPO, 2 pages.
Japanese Patent Office, Office Action Issued in Application No. 2019-553084, dated Sep. 25, 2020, 9 pages.

\* cited by examiner

*Primary Examiner* — Marc S Zimmer
(74) *Attorney, Agent, or Firm* — McCoy Russell LLP

(57) ABSTRACT

Provided are a silylamine compound, a composition for depositing a silicon-containing thin film containing the same, and a method for manufacturing a silicon-containing thin film using the composition, and more particularly, to a silylamine compound capable of being usefully used as a precursor of a silicon-containing thin film, a composition for depositing a silicon-containing thin film containing the same, and a method for manufacturing a silicon-containing thin film using the composition.

11 Claims, 2 Drawing Sheets

[FIG. 1]
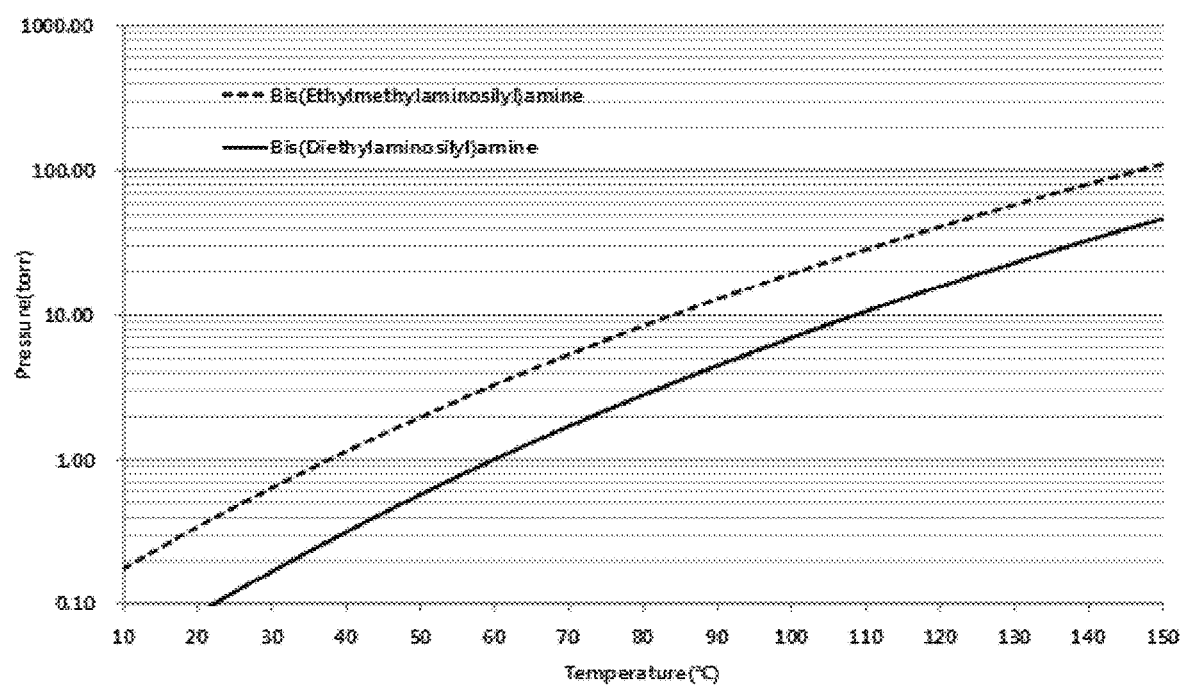
[FIG. 2]
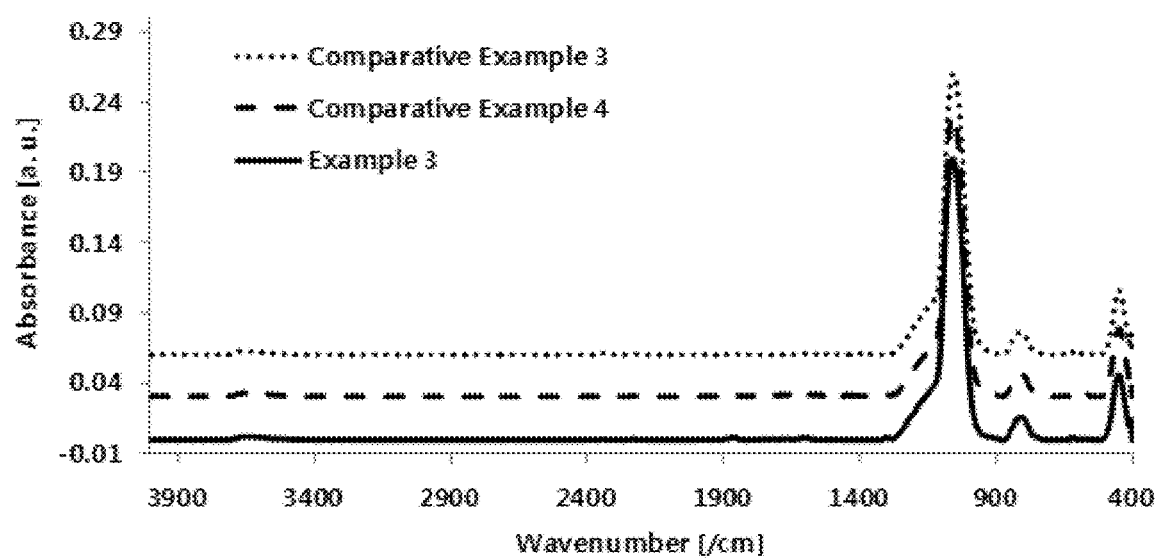

[FIG. 3]

| | Bis(Ethylmethylsilyl) amine | | Bisdiethylamino Silane | | [Bis(Diethylaminodimethylsilyl)]trimethylsilyl amine | |
|---|---|---|---|---|---|---|
| | Example 3 | | Comparative Example 3 | | Comparative Example 4 | |
| | THK (Å) | S/C (%) | THK (Å) | S/C (%) | THK (Å) | S/C (%) |
| TEM Image | | | | | | |
| Top | 178 | 100 | 194 | 100 | 154 | 100 |
| T-side | 178 | 100 | 194 | 100 | 151 | 96 |
| M-side | 178 | 100 | 193 | 99 | 148 | 94 |
| B-side | 178 | 100 | 193 | 99 | 137 | 87 |
| BTM | 178 | 100 | 191 | 99 | 147 | 94 |

SILYLAMINE COMPOUND, COMPOSITION FOR DEPOSITING SILICON-CONTAINING THIN FILM CONTAINING THE SAME, AND METHOD FOR MANUFACTURING SILICON-CONTAINING THIN FILM USING THE COMPOSITION

CROSS-REFERENCE TO RELATED APPLICATIONS

The present application is a U.S. National Phase of International Patent Application Ser. No. PCT/KR2018/003643 entitled "SILYLAMINE COMPOUND, COMPOSITION FOR DEPOSITING SILICON-CONTAINING THIN FILM CONTAINING THE SAME, AND METHOD FOR MANUFACTURING SILICON-CONTAINING THIN FILM USING THE COMPOSITION," filed on Mar. 28, 2018. International Patent Application Ser. No. PCT/KR2018/003643 claims priority to Korean Patent Application No. 10-2017-0040078 filed on Mar. 29, 2017 and Korean Patent Application No. 10-2018-0034940 filed on Mar. 27, 2018. The entire contents of each of the above-referenced applications are hereby incorporated by reference for all purposes.

TECHNICAL FIELD

The present invention relates to a silylamine compound, a composition for depositing a silicon-containing thin film containing the same, and a method for manufacturing a silicon-containing thin film using the composition, and more particularly, to a novel silylamine compound which is significantly useful as a precursor for depositing a silicon-containing thin film, a composition for depositing a silicon-containing thin film containing the same, and a method for manufacturing a silicon-containing thin film using the composition.

BACKGROUND ART

A silicon-containing thin film is manufactured through various deposition processes in a semiconductor field to thereby be manufactured in various forms such as a silicon film, a silicon oxide film, a silicon nitride film, a silicon carbonitride film, and a silicon oxynitride film, and the silicon-containing thin film may be applied in various fields.

Particularly, since the silicon oxide film and the silicon nitride film have a significantly excellent barrier property and oxidation resistance, the silicon oxide film and the silicon nitride film are used as an insulating film, a diffusion barrier, a hard mask, an etch stop layer, a seed layer, a spacer, a trench isolation, an intermetallic dielectric material, and a passivation layer in manufacturing an apparatus.

Recently, a polycrystalline silicon thin film has been used in a thin film transistor (TFT), a solar cell, and the like, and an application field thereof has been gradually diversified.

As a representative technology for manufacturing a silicon-containing thin film known in the art, there are a metal-organic chemical vapor deposition (MOCVD) method of reacting a gas-type silicon precursor and a reaction gas with each other to form a film on a surface of a substrate or directly reacting the gas-type silicon precursor and the reaction gas with each other on the surface to form a film and an atomic layer deposition (ALD) method of physically or chemically adsorbing a gas-type silicon precursor and sequentially injecting a reaction gas to form a film. Various technologies for manufacturing a thin film such as a low-pressure chemical vapor deposition (LPCVD) applying the above-mentioned method, a plasma-enhanced chemical vapor deposition (PECVD) and a plasma-enhanced atomic layer deposition (PEALD) method capable of performing deposition at a low temperature, and the like, are applied to processes for manufacturing next-generation semiconductors and display devices to thereby be used to form a ultra-fine pattern and deposit an ultra-thin film having uniform and excellent properties at a nano-scale thickness.

Representative examples of a precursor used to form the silicon-containing thin film may include silane, silane compounds, aminosilane, and alkoxysilane compounds. Specific examples thereof may include silane chloride compounds such as dichlorosilane ($SiH_2Cl_2$) and hexachlorodisilane ($Cl_3SiSiCl_3$), trisilylamine ($N(SiH_3)_3$), bis-diethylaminosilane ($H_2Si(N(CH_2CH_3)_2)_2$), di-isopropylaminosilane ($H_3SiN(i-C_3H_7)_2$), and the like. These precursors have been used in mass-production processes for manufacturing semiconductors and displays.

However, due to fineness of devices caused by ultra-high integration of the devices and an increase in aspect ratio, and diversification of materials of the devices, a technology of forming an ultra-fin thin film having a uniform and thin thickness and excellent electrical properties at a low temperature to be desired has been required. Therefore, a high-temperature process (600° C. or more) using an existing silicon precursor, a step coverage, etching properties, and physical and electric properties of the thin film have become problems, such that the development of a novel more excellent silicon precursor and a method for forming a thin film have been studied.

DISCLOSURE

Technical Problem

An object of the present invention is to provide a novel silylamine compound capable of being used as a precursor of a silicon-containing thin film.

Another object of the present invention is to provide a composition for depositing the silicon-containing thin film, containing the silylamine compound according to the present invention and a method for manufacturing a silicon-containing thin film using the composition for depositing a silicon-containing thin film.

Technical Solution

In one general aspect, there is provided a silylamine compound having excellent cohesive force, a high deposition rate, and excellent physical and electrical properties even at a low temperature, the silylamine compound being represented by the following Chemical Formula 1.

[Chemical Formula 1]

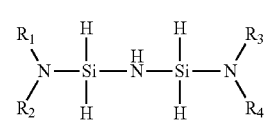

(In Chemical Formula 1, $R_1$ to $R_4$ are each independently (C1-C7)alkyl or (C2-C7)alkenyl, or $R_1$ and $R_2$, and $R_3$ and $R_4$ are each independently linked to each other to form a ring.)

Preferably, in the silylamine compound represented by Chemical Formula 1 according to the present invention, $R_1$ to $R_4$ may be each independently (C1-C5)alkyl or (C2-C5)alkenyl.

Preferably, the silylamine compound represented by Chemical Formula 1 according to an exemplary embodiment of the present invention may be represented by the following Chemical Formula 2 or 3.

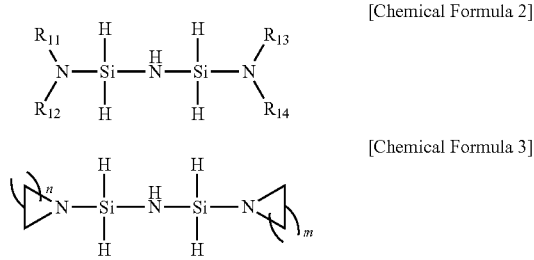

[Chemical Formula 2]

[Chemical Formula 3]

(In Chemical Formulas 2 and 3, $R_{11}$ to $R_{14}$ are each independently (C1-C5)alkyl or (C2-C5)alkenyl; and n and m are each independently an integer of 1 to 7.)

Preferably, in Chemical Formula 2 or 3 according to the exemplary embodiment of the present invention, $R_{11}$ to $R_{14}$ may be each independently (C1-C3)alkyl or (C2-C3)alkenyl; and n and m may be each independently an integer of 1 to 4. More preferably, $R_{11}$ to $R_{14}$ may be each independently (C1-C3)alkyl; and n and m may be each independently an integer of 1 to 3.

The silylamine compound represented by Chemical Formula 1 according to the exemplary embodiment of the present invention may be selected from the following compounds but is not limited thereto.

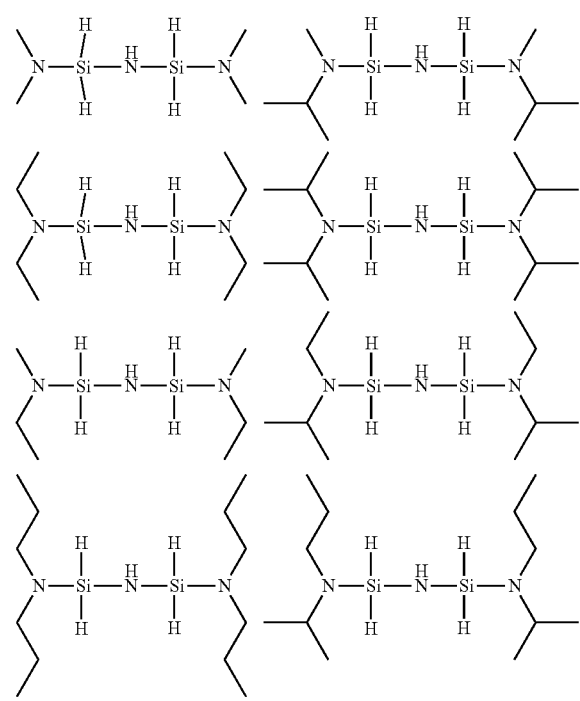

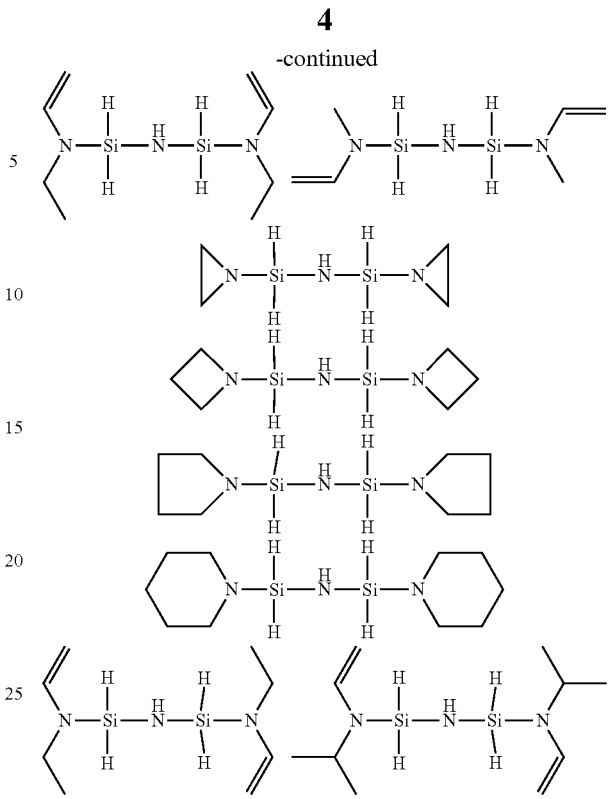

In another general aspect, there is provided a composition for depositing a silicon-containing thin film, containing the silylamine compound according to the exemplary embodiment of the present invention.

In another general aspect, there is provided a method for manufacturing a silicon-containing thin film using the composition for depositing a silicon-containing thin film according to the exemplary embodiment of the present invention.

In the method for manufacturing a silicon-containing thin film, the silicon-containing thin film may be formed by an atomic layer deposition (ALD) method, a chemical vapor deposition (CVD) method, a metal-organic chemical vapor deposition (MOCVD) method, a low-pressure chemical vapor deposition (LPCVD) method, a plasma-enhanced chemical vapor deposition (PECVD) method, or a plasma-enhanced atomic layer deposition (PEALD) method, and be a silicon oxide ($SiO_2$) film, a silicon oxy carbide (SiOC) film, a silicon nitride (SiN) film, a silicon oxy nitride (SiON) film, a silicon carbonitride (SiCN) film, or a silicon carbide (SiC) film.

More specifically, the method for manufacturing a silicon-containing thin film according to the present invention may include:

a) maintaining a temperature of a substrate mounted in a chamber at 30 to 400° C.;

b) contacting the composition for depositing a silicon-containing thin film according to the present invention with the substrate to adsorb the composition for depositing a silicon-containing thin film in the substrate; and c) injecting a reaction gas into the substrate in which the composition for depositing a silicon-containing thin film is adsorbed to form a silicon-containing thin film.

In the method for manufacturing a silicon-containing thin film, the reaction gas may be supplied after being activated by generating plasma at a plasma power of 50 to 1000 W.

Advantageous Effects

A novel silylamine compound according to the present invention is a liquid at room temperature and has high volatility and excellent thermal stability and reactivity, such that the silylamine compound is significantly useful as a precursor of a silicon-containing thin film.

Further, a composition for depositing a silicon-containing thin film according to the present invention contains the silylamine compound according to the present invention as the precursor, such that a high-quality silicon-containing thin film having a high purity and durability may be provided under lower power and film formation temperature conditions.

Further, in a method for manufacturing a silicon-containing thin film using the composition for depositing a silicon-containing thin film according to the present invention, an excellent deposition rate and excellent stress intensity may be implemented even under a low film formation temperature condition, and in the silicon-containing thin film manufactured thereby, contents of impurities such as carbon, oxygen, and hydrogen are minimized, such that the silicon-containing thin film may have a high purity, excellent physical and electrical properties, and excellent water vapor transmission rate and step coverage.

BRIEF DESCRIPTION OF THE FIGURES

FIG. 1 is a view illustrating results obtained by measuring vapor pressures of bis(ethylmethylaminosilyl)amine and bis (diethylaminosilyl)amine compounds prepared in Examples 1 and 2.

FIG. 2 is a view illustrating results obtained by analyzing silicon oxide thin films manufactured in Example 3 and Comparative Examples 3 and 4 using infrared spectroscopy.

FIG. 3 is a view illustrating results obtained by analyzing silicon oxide thin films manufactured in Example 3 and Comparative Examples 3 and 4 using a transmission electron microscope (TEM).

DETAILED DESCRIPTION

BEST MODE

The present invention provides a silylamine compound, which is a liquid at room temperature and has high volatility and excellent thermal stability to thereby be used as a significantly useful precursor of forming a silicon-containing thin film, wherein the silylamine compound is represented by the following Chemical Formula 1.

[Chemical Formula 1]

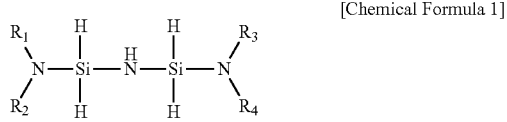

(In Chemical Formula 1, $R_1$ to $R_4$ are each independently (C1-C7)alkyl or (C2-C7)alkenyl, or $R_1$ and $R_2$, and $R_3$ and $R_4$ are each independently linked to each other to form a ring.)

In the silylamine compound contained in the composition for depositing a silicon-containing thin film, amine has two aminosilyl functional groups as substituents, and each silicon atom in these two aminosilyl functional groups necessarily has two hydrogen atoms attached thereto, such that the silylamine compound, which is a liquid at room temperature, has high volatility and excellent reactivity with a surface and a reaction gas. Therefore, the silylamine compound may be significantly usefully used to form the silicon-containing thin film.

More specifically, the silylamine compound is a compound having a silazane backbone, but a compound which necessarily has two aminosilyl functional groups

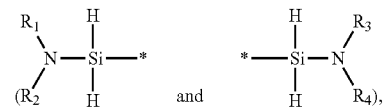

and in which each silicon atom of the aminosilyl functional groups necessarily has two hydrogen atoms attached thereto may be more useful as a precursor for depositing a thin film.

More preferably, in Chemical Formula 1 according to the present invention, $R_1$ to $R_4$ are each independently (C1-C5) alkyl or (C2-C5)alkenyl, and more preferably, (C1-C3)alkyl or (C2-C3)alkenyl.

Preferably, the silylamine compound represented by Chemical Formula 1 according to the present invention may be represented by the following Chemical Formula 2 or 3.

[Chemical Formula 2]

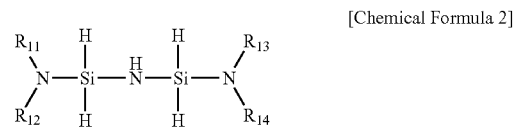

[Chemical Formula 3]

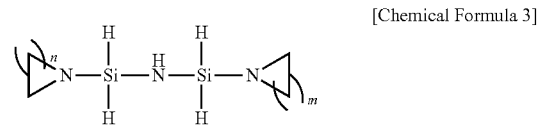

(In Chemical Formulas 2 and 3, $R_{11}$ to $R_{14}$ are each independently (C1-C5)alkyl or (C2-C5)alkenyl; and n and m are each independently an integer of 1 to 7.)

In the silylamine compound, each silicon atom of two aminosilyl groups in the silazane backbone necessarily has two hydrogen atoms attached thereto, such that the silylamine compound has a more excellent effect as the precursor for depositing a silicon-containing thin film.

Preferably, in Chemical Formula 2 or 3 according to the exemplary embodiment of the present invention, $R_{11}$ to $R_{14}$ may be each independently (C1-C3)alkyl or (C2-C3)alkenyl; and n and m may be each independently an integer of 1 to 4. More preferably, $R_{11}$ to $R_{14}$ may be each independently (C1-C3)alkyl; and n and m may be each independently an integer of 1 to 3.

It is more preferable that the silylamine compound represented by Chemical Formula 1 according to the present invention is a compound represented by the following Chemical Formula 4 in which both sides of an NH group are symmetric to each other in order to have more excellent effect as the precursor for depositing a silicon-containing thin film.

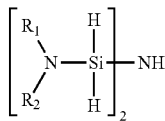

[Chemical Formula 4]

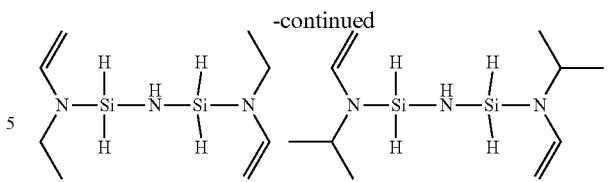

(In Chemical Formula 4, $R_1$ and $R_2$ are each independently (C1-C7)alkyl or (C2-C7)alkenyl, or are linked to each other to form a ring.)

The silylamine compound represented by Chemical Formula 1 according to the exemplary embodiment of the present invention may be selected from the following compounds, but is not limited thereto.

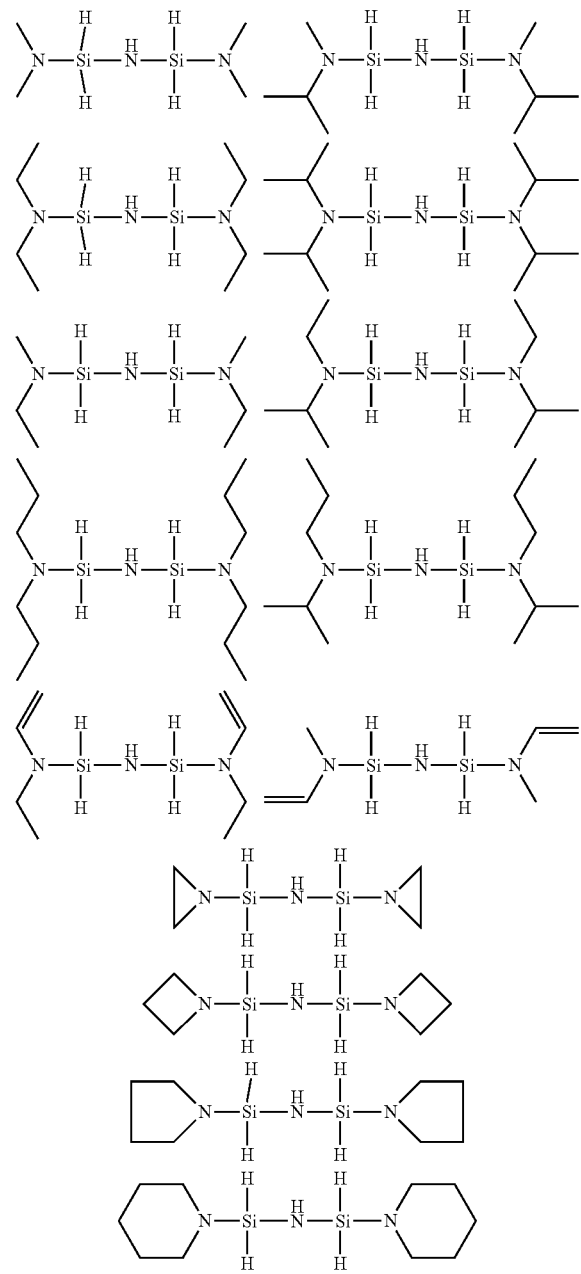

In addition, the present invention provides a composition for depositing a silicon-containing thin film, containing the silylamine compound according to the exemplary embodiment of the present invention.

The composition for depositing a silicon-containing thin film according to the present invention necessarily contains the silylamine compound represented by Chemical Formula 1 according to the exemplary embodiment of the present invention as the precursor for depositing a thin film, and the silylamine compound in the composition for depositing a silicon-containing thin film may be contained in a content range in which the content may be recognized by those skilled in the art in consideration of film formation conditions, a thickness, properties, or the like, of the thin film.

As used herein, the term "alkyl" means linear, branched, and cyclic saturated and unsaturated hydrocarbons having 1 to 7 carbon atoms, preferably, 1 to 5 carbon atoms, and more preferably 1 to 3 carbon atoms, and examples thereof may include methyl, ethyl, propyl, isobutyl, pentyl, and the like.

As used herein, the term "halogen" means a halogen element, and examples thereof include fluoro, chloro, bromo, iodo.

As disclosed herein, the term "alkenyl" as a single group or a part of another group means a straight-chain, branched-chain, or cyclic hydrocarbon radical having 2 to 7 carbon atoms and one or more carbon-carbon double bonds. A more preferable alkenyl radical is a lower alkenyl radical having 2 to 5 carbon atoms. The most preferable lower alkenyl radical is a lower alkenyl radical having about 2 to 3 carbon atoms. Further, an alkenyl group may be substituted at a random usable attachment point. Examples of the alkenyl radical include ethenyl, propenyl, allyl, butenyl, and 4-methylbutenyl. The terms "alkenyl" and "lower alkenyl" include radicals having cis and trans orientations or alternatively, E and Z orientations.

As used herein, the phrase "$R_1$ and $R_2$, and $R_3$ and $R_4$ are each independently linked to each other to form a ring" includes the case in which $R_1$ and $R_2$ are linked to each other to form a ring but $R_3$ and $R_4$ do not form a ring; the case in which on the contrary, $R_1$ and $R_2$ do not form a ring but $R_3$ and $R_4$ are linked to each other to form a ring; and the case in which $R_1$ and $R_2$ are linked to each other to form a ring and $R_3$ and $R_4$ are linked to each other to form a ring, wherein the formed ring may be an alicyclic or aromatic ring containing N, and preferably, an alicyclic ring.

The silylamine compound represented by Chemical Formula 1 according to the present invention may be prepared by any method as long as the method may be recognized by those skilled in the art. As an example, the silylamine compound may be prepared by reacting compounds represented by the following Chemical Formulas 11, Chemical Formulas and Chemical Formulas 13.

[Chemical Formula 11]

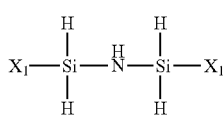

-continued

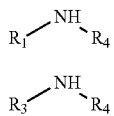
[Chemical Formula 12]

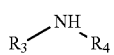
[Chemical Formula 13]

(In Chemical Formulas 11 to 13, $R_1$ to $R_4$ are each independently (C1-C7)alkyl or (C2-C7)alkenyl, or $R_1$ and $R_2$, and $R_3$ and $R_4$ are each independently linked to each other to form a ring, and $X_1$ is halogen.)

Preferably, the compounds represented by Chemical Formulas 12 and 13 according to the exemplary embodiment of the present invention may be used in a content of 1.1 to 4.2 moles based on 1 mole of the compound represented by Chemical Formula 11, and a reaction may be performed at room temperature, specifically at 18 to 35° C. for 2 to 8 hours.

The compound represented by Chemical Formula 11 according to the exemplary embodiment of the present invention may be synthesized by any method as long as the method may be recognized by those skilled in the art. As an example, the compound may be prepared by reacting compounds represented by the following Chemical Formulas 14 and 15 with each other in the presence of an acid.

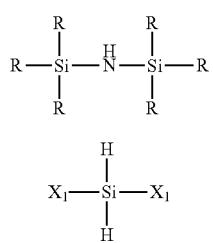
[Chemical Formula 14]

[Chemical Formula 15]

(In Chemical Formulas 14 and 15, R is (C1-C7)alkyl, and $X_1$ is halogen.)

As an acid according to the exemplary embodiment of the present invention, any acid may be used as long as it is a Lewis acid, but $AlCl_3$ may be preferably used.

The compound represented by Chemical Formula 15 may be used in a content of 2 to 4.5 moles based on 1 mole of the compound represented by Chemical Formula 14, and the Lewis acid may be used 0.005 to 1 mole, more preferably 0.005 to 0.01 moles based on 1 mole of the compound represented by Chemical Formula 14. A reaction may be performed at −30 to −5° C. for 1 to 6 hours.

In addition, the present invention provides a method for manufacturing a silicon-containing thin film using the composition for depositing a silicon-containing thin film according to the exemplary embodiment of the present invention.

In the method for manufacturing a silicon-containing thin film according to the present invention, the composition for depositing a silicon-containing thin film according to the exemplary embodiment of the present invention, containing the silylamine compound represented by Chemical Formula 1 which is a liquid at room temperature and has high volatility and excellent thermal stability as the precursor is used, such that the handling may be easy, it is possible to manufacture various thin films, and it is possible to manufacture a silicon-containing thin film having a high purity at a high deposition rate even at a low temperature and a low power.

Further, a silicon-containing thin film manufactured by the method according to the present invention has excellent durability and electric properties, and resistance against hydrogen fluoride, water vapor transmission rate, and step coverage thereof are also excellent.

In the method for manufacturing a silicon-containing thin film according to the present invention, the silicon-containing thin film may be formed by any method as long as it may be recognized by those skilled in the art. However, preferably, the silicon-containing thin film may be formed by an atomic layer deposition (ALD) method, a chemical vapor deposition (CVD) method, a metal-organic chemical vapor deposition (MOCVD) method, a low-pressure chemical vapor deposition (LPCVD) method, a plasma enhanced chemical vapor deposition (PECVD) method, or a plasma enhanced atomic layer deposition (PEALD) method, but PECVD, ALD, or PEALD is more preferable in order to allow the thin film to be more easily deposited, and allow the manufactured thin film to have excellent properties.

The silicon-containing thin film according to the present invention may be a silicon oxide ($SiO_2$) film, a silicon oxy carbide (SiOC) film, a silicon nitride (SiN) film, a silicon oxy nitride (SiON) film, a silicon carbonitride (SiCN) film, or a silicon carbide (SiC) film, and various thin films having high quality may be manufactured.

More specifically, the method for manufacturing a silicon-containing thin film according to the present invention may include:

a) maintaining a temperature of a substrate mounted in a chamber at 30 to 500° C., preferably 30 to 150° C., and more preferably 30 to 100° C.;

b) contacting the composition for depositing a silicon-containing thin film according to the present invention with the substrate to adsorb the composition for depositing a silicon-containing thin film in the substrate; and c) injecting a reaction gas into the substrate in which the composition for depositing a silicon-containing thin film is adsorbed to form a silicon-containing thin film.

More specifically, the method for manufacturing a silicon-containing thin film according to the present invention may include:

a) maintaining a temperature of a substrate mounted in a chamber at 30 to 500° C.;

b) contacting the composition for depositing a silicon-containing thin film with the substrate to adsorb the composition for depositing a silicon-containing thin film in the substrate;

c) purging the remaining composition for depositing a silicon-containing thin film and by-products;

d) injecting a reaction gas into the substrate in which the composition for depositing a silicon-containing thin film is adsorbed to form a silicon-containing thin film; and e) purging the remaining reaction gas and by-products, wherein the reaction gas in step D) may remove a ligand of the silylamine compound contained in the composition for depositing a silicon-containing thin film to form a Si—O atomic layer.

Preferably, the reaction gas according to the exemplary embodiment may be supplied after being activated by generating plasma at a plasma power of 50 to 1000 W.

In the method for manufacturing a silicon-containing thin film according to the exemplary embodiment of the present invention, the silylamine compound according to the present invention is used as the precursor, such that deposition may be performed at a low temperature of 50 to 90° C., and the reaction gas may be activated by generating plasma at a low plasma power of 50 to 400 W, thereby making it possible to manufacture the thin film. In the method for manufacturing a silicon-containing thin film according to the exemplary embodiment of the present invention, deposition conditions may be adjusted depending on a structure or thermal properties of a desired thin film. Examples of the deposition condition according to the exemplary embodiment of the present invention may include an injection flow rate of the composition for depositing a silicon-containing thin film containing the silylamine compound, injection flow rates of the reaction gas and a carrier gas, pressure, RF power, the temperature of the substrate, and the like. As non-restrictive examples of the deposition conditions, the injection flow rate of the composition for depositing a silicon-containing thin film may be adjusted in a range of 10 to 1000 cc/min, the injection flow rate of the carrier gas may be adjusted in a range of 10 to 1000 cc/min, the injection flow rate of the reaction gas may be adjusted in a range of 1 to 1500 cc/min, the pressure may be adjusted in a range of 0.5 to 10 torr, the RF power may be adjusted in a range of 50 to 1000 W, and the temperature of the substrate may be adjusted in a range of 30 to 500° C., preferably 30 to 200° C., but the deposition conditions are not limited thereto.

The reaction gas used in the method for manufacturing a silicon-containing thin film according to the present invention is not limited, but may be one selected from hydrogen ($H_2$), hydrazine ($N_2H_4$), ozone ($O_3$), oxygen ($O_2$), nitrous oxide ($N_2O$) ammonia ($NH_3$), nitrogen ($N_2$), silane ($SiH_4$), borane ($BH_3$), diborane ($B_2H_6$), and phosphine ($PH_3$), or a mixed gas of one or more thereof, and the carrier gas may be one selected from nitrogen ($N_2$), argon (Ar), and helium (He), or a mixed gas of two or more thereof.

The substrate used in the method for manufacturing a silicon-containing thin film according to the present invention may be a substrate containing one or more semiconductor materials selected from Si, Ge, SiGe, GaP, GaAs, SiC, SiGeC, InAs, and InP; a silicon-on-insulator (SOI) substrate; a quartz substrate; a glass substrate for a display; or a flexible plastic substrate made of polyimide, polyethylene terephthalate (PET), polyethylene naphthalate (PEN), polymethylmethacrylate (PMMA), polycarbonate (PC), polyethersulfone (PES), polyester, and the like, but is not limited thereto.

Further, the silicon-containing thin film may be directly formed on the substrate. Alternatively, a large number of conductive layers, dielectric layers, insulating layers, or the like, may also be formed between the substrate and the silicon-containing thin film.

Preferably, the composition for depositing a silicon-containing thin film according to the exemplary embodiment of the present invention may be used as an encapsulant of an organic light emitting diode (OLED).

The present invention will be described in detail with reference to the following Examples. The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the present invention.

Therefore, configurations described in the embodiments and shown in the drawings of the present specification indicate only the most preferred example rather than indicating all the technical ideas of the present invention and therefore, it is to be understood that various equivalents and modifications that can replace the above configurations may be present.

Further, in all the following Examples, deposition was performed by a plasma enhanced atomic layer deposition (PEALD) method known in the art using a commercialized 200 mm single wafer shower head type ALD apparatus (CN1, Atomic Premium). In addition, deposition was performed by a plasma enhanced chemical vapor deposition (PECVD) method known in the art using a commercialized 200 mm single wafer shower head type CVD (PECVD) apparatus (CN1, Atomic Premium).

A thickness of a deposited silicon-containing thin film was measured using an ellipsometer (OPTI-PROBE 2600, THERNIA-WAVE), and a composition of the manufactured silicon-containing thin film was analyzed using infrared spectroscopy (IFS66V/S & Hyperion 3000, Bruker Optics) and X-ray photoelectron spectroscopy.

Further, a step coverage was confirmed using a transmission electron microscope (Tecnai F30 S-Twin, FEI Korea).

[Example 1] Preparation of Bis(Ethylmethylaminosilyl)Amine

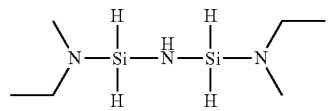

Under an anhydrous and inert atmosphere, after putting hexamethyl disilazane ((($CH_3$)$_3$Si)$_2$NH, 1,695 g (10.5 mol)) and aluminum chloride ($AlCl_3$, 7 g (0.05 mol)) into a 5000 mL Sus flame-dried reactor, dichloro silane ($SiH_2Cl_2$, 2,121 g (21 mol)) was slowly added thereto while stirring the mixture and maintaining a temperature at −25° C. Then, a reaction solution was stirred at −10° C. This mixture reaction solution was stirred for 3 hours, aluminum chloride ($AlCl_3$) was removed therefrom by filtration, and the formed chlorotrimethylsilane (($CH_3$)$_3$SiCl) was removed by simple distillation or distillation under reduced pressure. While stirring a recovered bis(chlorosilyl)amine (($SiH_2Cl$)$_2$NH) solution with n-pentane and maintaining a temperature at −25° C., ethylmethylamine (($CH_3CH_2$)$CH_3NH$), 676 g (11.44 mol)) were slowly added thereto. After the addition was completed, the reaction solution was slowly heated to room temperature and stirred at room temperature for 6 hours. The formed white solid was removed by filtration, thereby obtaining a filtrate. A solvent was removed from this filtrate under reduced pressure, followed by distillation under reduced pressure, thereby obtaining bis(ethylmethyl-aminosilyl)amine ((($SiH_2NCH_3(CH_2CH_3)$)$_2$NH, 200 g (1.04 mol), yield: 33%).

$^1$H-NMR(in $CDCl_3$): δ 2.52 (s, 6H, ((($SiH2NC\underline{H}3(CH2CH3))2NH$), δ 4.48 (d, 4H, ((($Si\underline{H}2NCH3(CH2CH3))2NH$), δ 1.04 (t, 6H, (($SiH2NCH3(CH2C\underline{H}3))2NH$, δ 2.86 (q, 4H (($SiH2NCH3(C\underline{H}2CH3))2NH$).

[Example 2] Preparation of Bis(Diethylaminosilyl)Amine

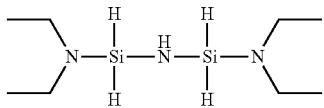

Bis(diethylaminosilyl)amine was prepared in the same manner as in Example 1 except for using diethylamine instead of ethylmethylamine in Example 1.

$^1$H-NMR (in CDCl$_3$): δ1.02 (t, 12H, (((SiH2(N(CH2C<u>H3</u>)<u>2</u>))<u>2</u>NH), δ 2.89 (q, 8H, (((SiH2(N(C<u>H2</u>CH3)<u>2</u>))<u>2</u>NH), δ 4.51 (d, 4H, (((Si<u>H2</u>(N(CH2CH3)2))<u>2</u>NH)

[Comparative Example 1] Preparation of Bis(Diethylamino)Silane

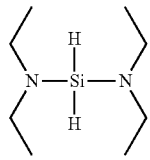

Under an anhydrous and inert atmosphere, after putting dichlorosilane (SiH$_2$Cl$_2$, 300 g (2.97 mol)) and n-hexane (2,887 g (33.5 mol)) into a 5000 mL flame-dried Sus reactor (a high-pressure reactor) and slowly adding diethylamine (CH$_3$CH$_2$)$_2$NH, 931 g (12.47 mol)) thereto while maintaining a temperature at −25° C., the mixture was stirred for 3 hours, and diethylamine hydrochloride ((CH$_3$CH$_2$)$_2$NHHCl)) was removed by filtration, thereby obtaining a filtrate. A solvent was removed from this filtrate under reduced pressure, followed by distillation under reduced pressure, thereby obtaining bis(diethylaminosilane) (SiH$_2$(N (CH$_2$CH$_3$)$_2$)$_2$, 388 g (2.22 mol), yield: 75%).

$^1$H-NMR(inC6D6): δ 0.98 (t, 12H (SiH2(N(CH2 C<u>H3</u>)<u>2</u>)<u>2</u>), 2.86 (q, 8H)(SiH2(N(C<u>H2</u>CH3)<u>2</u>)<u>2</u>), 4.71 (s, 2H (Si<u>H2</u>(N(CH2CH3)2)2)

[Comparative Example 2] Preparation of [Bis (Di-ethylaminodimethylsilyl)]Trimethylsilylamine

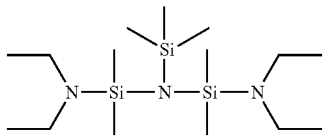 [SMILES: CCN(CC)[Si](C)(C)N([Si](C)(C)C)[Si](C)(C)N(CC)CC]

Under an anhydrous and inert atmosphere, after putting hexamethyl disilazane (((CH$_3$)$_3$Si)$_2$NH, 250 g (1.55 mol)) and aluminum chloride (AlCl$_3$, 10 g (0.075 mol)) into a 2000 mL flame-dried Schlenk flask, dichloro dimethylsilane ((CH$_3$)$_2$SiCl$_2$, 499.80 g (3.87 mol)) was slowly added thereto while stirring the mixture and maintaining a temperature at 25° C. Then, a reaction solution was slowly heated to 40° C. This mixture reaction solution was stirred for 3 hours, and formed chloro trimethylsilane ((CH$_3$)$_3$SiCl) and excessively added dichloro dimethylsilane ((CH$_3$)$_2$SiCl$_2$) were removed by simple distillation or distillation under reduced pressure. While stirring the recovered chloro dimethyldisilazane (((CH$_3$)$_2$SiCl)$_2$NH)) solution with hexane (C$_6$H$_{14}$) and maintaining a temperature at −15° C., diethyl amine ((CH$_3$CH$_2$)$_2$NH, 475.45 g (6.5 mol)) was slowly added thereto. After the addition was completed, the reaction solution was slowly heated to room temperature and stirred at room temperature for 6 hours. After obtaining a filtrate by removing the formed white solid by filtration, a solvent was removed from the filtrate under reduced pressure. After putting the recovered diethylamino dimethyldisilazane ((CH$_3$)$_2$SiN(CH$_2$CH$_3$)$_2$)$_2$NH) and n-hexane (organic solvent, 200 mL), 2.29M normal butyl lithium (n-C$_4$H$_9$Li) hexane (C$_6$H$_{14}$) solution (202.16 g (0.65 mol)) was slowly added thereto while stirring the mixture and maintaining a temperature at −15° C. After the addition was completed, the reaction solution was slowly heated to room temperature and stirred for 12 hours. Then, tetrahydrofuran (O(C$_2$H$_2$)$_2$, 200 mL) was added thereto. Chloro trimethylsilane (70.94 g (0.65 mol)) was slowly added to the reaction solution while maintaining a temperature at −20° C. After the addition was completed, the reaction solution was slowly heated, and stirred for 12 hours while maintaining the temperature at 65° C. After obtaining a filtrate by filtering the reaction mixture in which a reaction was terminated to remove a formed white solid, a solvent was removed from the filtrate under reduced pressure, followed by distillation under reduced pressure, thereby obtaining bisdiethylaminodimethylsilyl trimethylsilylamine ((CH$_3$)$_3$SiN(Si(CH$_3$)$_2$N (CH$_2$CH$_3$)$_2$)$_2$, 159 g (0.46 mol), yield: 70%).

$^1$H-NMR (inC6D6): δ 0.30 (s, 12H, NSi(CH3)2N), 0.32 (s, 9H, Si(CH3)3), 0.99 (t, 12H, Si(NCH2CH3)2), 2.82 (q, 8H, Si(NCH2CH3)2)

[Example 3] Manufacturing of Silicon Oxide Thin Film by PEALD Using Bis(Ethylmethylaminosilyl)Amine Film formation was evaluated using the silylamine compound prepared in Example 1 according to the present invention as a composition for forming a silicon oxide film in a general plasma enhanced atomic layer deposition (PEALD) apparatus using a plasma enhanced atomic layer deposition (PEALD) method known in the art. As a reaction gas, nitrous oxide was used together with plasma, and nitrogen corresponding to an inert gas was used for purging. The film was formed at reaction gas and plasma time of 0.5 seconds. A specific method for depositing a silicon oxide thin film was illustrated in Table 1.

A thickness of a deposited thin film was measured using the Ellipsometer, formation of the silicon oxide thin film was analyzed using infrared spectroscopy, and a composition of the silicon oxide thin film was analyzed using X-ray photoelectron spectroscopy. Further, a step coverage was confirmed using a transmission electron microscope (TEM). Specific analysis results of the silicon oxide thin film were illustrated in Table 2, and a result obtained by analyzing the deposited film using infrared spectroscopy was illustrated in FIG. 2.

[Comparative Example 3] Manufacturing of Silicon Oxide Thin Film by PEALD Using Bis(Diethylamino)Silane Film formation was evaluated using the bis(diethylamino) silane compound for forming a silicon oxide film in a general plasma enhanced atomic layer deposition (PEALD) apparatus using a plasma enhanced atomic layer deposition (PEALD) method known in the art. As a reaction gas, nitrous oxide was used together with plasma, and nitrogen corresponding to an inert gas was used for purging. The film was formed at reaction gas and plasma time of 0.5 seconds. A specific method for depositing a silicon oxide thin film was illustrated in Table 1.

A thickness of a deposited thin film was measured using the Ellipsometer, formation of the silicon oxide thin film was analyzed using infrared spectroscopy, and a composition of the silicon oxide thin film was analyzed using X-ray photoelectron spectroscopy. Further, a step coverage was confirmed using a transmission electron microscope (TEM). Specific analysis results of the silicon oxide thin film were illustrated in Table 2, and a result obtained by analyzing the deposited film using infrared spectroscopy was illustrated in FIG. 2.

[Comparative Example 4] Manufacturing of Silicon Oxide Thin Film by PEALD Using [Bis(Diethylaminodimethylsilyl)]Trimethylsilylamine Film formation was evaluated using a [bis(diethylaminodimethylsilyl)]trimethylsilylamine compound in order to form a silicon oxide film in a general plasma enhanced atomic layer deposition (PEALD) apparatus using a plasma enhanced atomic layer deposition (PEALD) method known in the art. As a reaction gas, nitrous oxide was used together with plasma, and nitrogen corresponding to an inert gas was used for purging. The film was formed at reaction gas and plasma time of 0.5 seconds. A specific method for depositing a silicon oxide thin film was illustrated in Table 1.

A thickness of a deposited thin film was measured using the Ellipsometer, formation of the silicon oxide thin film was analyzed using infrared spectroscopy, and a composition of the silicon oxide thin film was analyzed using X-ray photoelectron spectroscopy. Further, a step coverage was confirmed using a transmission electron microscope (TEM). Specific analysis results of the silicon oxide thin film were illustrated in Table 2, and a result obtained by analyzing the deposited film using infrared spectroscopy was illustrated in FIG. 2.

TABLE 2-continued

Evaluation of Properties of Silicon Oxide Thin Film

| | Deposition Rate (Å/cycle) | Thickness of Film (Å) | Step Coverage (%) | Refractive Index | O/Si Composition Ratio |
|---|---|---|---|---|---|
| Comparative Example 4 | 1.71 | 257 | 93 | 1.48 | 1.71 |

As illustrated in Table 2, it may be appreciated that the silicon oxide film manufactured using a composition for depositing a silicon-containing thin film containing the silylamine compound according to the present invention as a precursor has an excellent step coverage while having an excellent deposition rate as compared to the silicon oxide films in Comparative Examples 3 and 4.

That is, as illustrated in Table 2 and FIG. 3, in the silicon oxide film in Example 3 according to the present invention, the refractive index and the O/Si composition rate were similar to those in Comparative Examples 3 and 4, the deposition rate was excellent, the thickness of the thin film was significantly increased, and the step coverage also was excellent, as compared to the silicon oxide films in Comparative Examples 3 and 4.

The invention claimed is:

1. A silylamine compound represented by the following Chemical Formula 1:

[Chemical Formula 1]

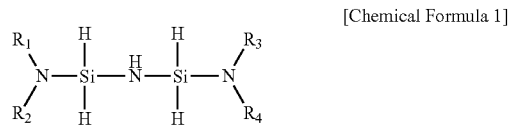

in Chemical Formula 1, $R_1$ to $R_4$ are each independently C1-C7alkyl or C2-C7alkenyl, or $R_1$ and $R_2$, and $R_3$ and $R_4$ are each independently linked to each other to form a ring.

2. The silylamine compound of claim 1, wherein in Chemical Formula 1, $R_1$ to $R_4$ are each independently C1-C5alkyl or C2-C5alkenyl.

3. The silylamine compound of claim 1, wherein the silylamine compound represented by Chemical Formula 1 is represented by the following Chemical Formula 2 or 3:

TABLE 1

Deposition Conditions of Silicon Oxide Thin Film by PEALD

| | | | | Purge | | Reaction Gas and Plasma | | | Reaction Gas Purge | | | |
|---|---|---|---|---|---|---|---|---|---|---|---|---|
| | Temperature of Substrate (° C.) | Heating Temperature (° C.) | Injection Time (sec) | Flow Rate (sccm) | Time (sec) | Flow Rate (sccm) | RF Power (W) | Time (sec) | Flow Rate (sccm) | Time (sec) | Number of Deposition Cycle | Process Time (sec) |
| Example 3 | 50 | 38 | 0.1 | 600 | 0.4 | 300 | 400 | 0.5 | 300 | 0.1 | 150 | 165 |
| Comparative Example 3 | 50 | 51 | 0.1 | 600 | 0.4 | 300 | 400 | 0.5 | 300 | 0.1 | 150 | 165 |
| Comparative Example 4 | 50 | 50 | 0.1 | 600 | 0.4 | 300 | 400 | 0.5 | 300 | 0.1 | 150 | 165 |

TABLE 2

Evaluation of Properties of Silicon Oxide Thin Film

| | Deposition Rate (Å/cycle) | Thickness of Film (Å) | Step Coverage (%) | Refractive Index | O/Si Composition Ratio |
|---|---|---|---|---|---|
| Example 3 | 2.48 | 372 | 100 | 1.48 | 1.7 |
| Comparative Example 3 | 1.37 | 206 | 100 | 1.48 | 1.73 |

[Chemical Formula 2]

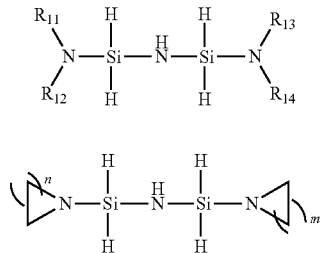

[Chemical Formula 3]

in Chemical Formulas 2 and 3, $R_{11}$ to $R_{14}$ are each independently C1-C5alkyl or C2-C5alkenyl; and n and m are each independently an integer of 1 to 7.

4. The silylamine compound of claim 3, wherein in Chemical Formula 2, $R_{11}$ to $R_{14}$ are each independently C1-C3alkyl or C2-C3alkenyl; and wherein in Chemical Formula 3, n and m are each independently an integer of 1 to 4.

5. The silylamine compound of claim 1, wherein the silylamine compound represented by Chemical Formula 1 is selected from the following compounds:

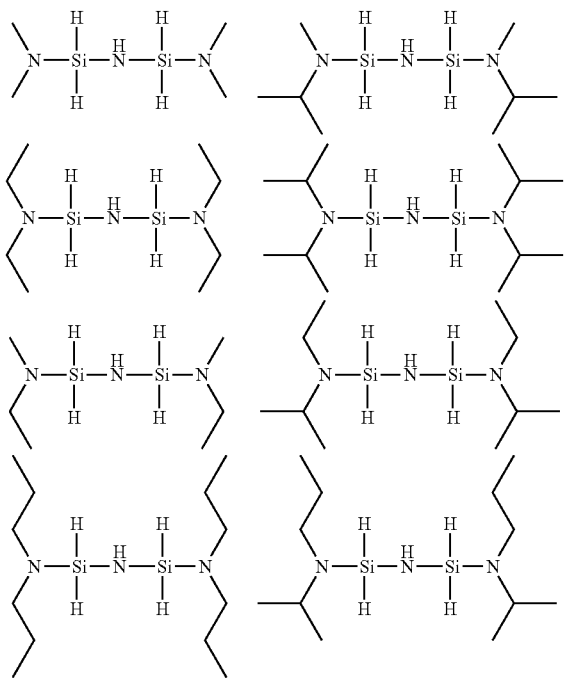

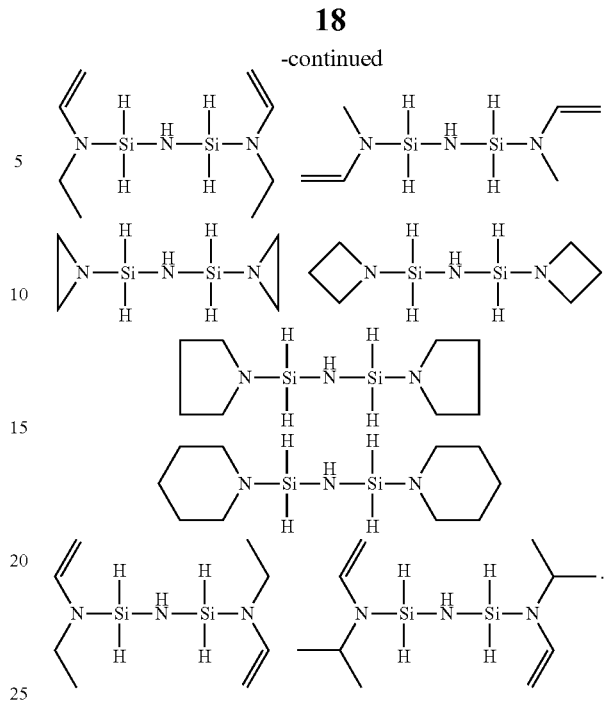

6. A composition for depositing a silicon-containing thin film, the composition comprising the silylamine compound of claim 1.

7. A method for manufacturing a silicon-containing thin film comprising depositing the composition of claim 6 onto a substrate.

8. The method of claim 7, wherein deposition is performed by an atomic layer deposition method, a chemical vapor deposition method, a metal-organic chemical vapor deposition method, a low-pressure chemical vapor deposition method, a plasma-enhanced chemical vapor deposition method, or a plasma-enhanced atomic layer deposition method.

9. The method of claim 7, wherein the silicon-containing thin film is a silicon oxide film, a silicon oxy carbide film, a silicon nitride film, a silicon oxy nitride film, a silicon carbonitride film, or a silicon carbide film.

10. The method of claim 7, comprising:

a) maintaining a temperature of a substrate mounted in the chamber at 30 to 500☐;

b) contacting the composition of claim 6 with the substrate to adsorb the composition in the substrate; and c) injecting a reaction gas into the substrate in which the composition is adsorbed to form a silicon-containing thin film.

11. The method of claim 7, wherein the reaction gas is supplied after being activated by generating plasma with a plasma power of 50 to 1000 W.

* * * * *